United States Patent
Tanaka

(10) Patent No.: US 8,319,943 B2
(45) Date of Patent: Nov. 27, 2012

(54) EXPOSURE APPARATUS, LIGHT SOURCE APPARATUS AND METHOD OF MANUFACTURING DEVICE

(75) Inventor: Hiroshi Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 378 days.

(21) Appl. No.: 12/642,726

(22) Filed: Dec. 18, 2009

(65) Prior Publication Data

US 2010/0166030 A1    Jul. 1, 2010

(30) Foreign Application Priority Data

Dec. 26, 2008 (JP) ................ 2008-335220

(51) Int. Cl.
*G03B 27/42* (2006.01)
(52) U.S. Cl. ...................................................... 355/53
(58) Field of Classification Search ............... 355/53
See application file for complete search history.

(56) References Cited

U.S. PATENT DOCUMENTS

| | | | | |
|---|---|---|---|---|
| 5,148,214 A | * | 9/1992 | Ohta et al. | 355/43 |
| 2006/0279717 A1 | * | 12/2006 | Hirano | 355/53 |
| 2007/0014326 A1 | * | 1/2007 | Wakabayashi et al. | 372/92 |
| 2008/0285602 A1 | | 11/2008 | Nagai et al. | |

FOREIGN PATENT DOCUMENTS

| | | |
|---|---|---|
| JP | 2004-288874 A | 10/2004 |
| JP | 2006-024855 A | 1/2006 |

* cited by examiner

*Primary Examiner* — Peter B Kim
*Assistant Examiner* — Mesfin T Asfaw
(74) *Attorney, Agent, or Firm* — Canon U.S.A., Inc. IP Division

(57) ABSTRACT

An apparatus exposes a substrate via a pattern of a reticle using pulsed light generated by a light source, and includes a controller configured to control the light source so that the oscillation frequency of the light source changes periodically while the apparatus exposes the substrate. The oscillation frequency is the number of times of emission of the light source per unit time.

6 Claims, 2 Drawing Sheets

EXPOSURE APPARATUS, LIGHT SOURCE APPARATUS AND METHOD OF MANUFACTURING DEVICE

BACKGROUND OF THE INVENTION

1. Field of the Invention

The present invention relates to an exposure apparatus, a light source apparatus and a method of manufacturing a device.

2. Description of the Related Art

In recent years, microfabrication techniques for projecting and transferring a finer pattern onto a substrate by an exposure apparatus available for a semiconductor manufacturing process are making remarkable progress. Under the circumstance, the wavelength of the exposure light is shortening, aiming at further improving the resolution of the exposure apparatus. As the wavelength of the exposure light shortens, the exposure light sources have shifted to KrF and ArF excimer lasers serving as kinds of gas lasers.

Because such an excimer laser can select only specific wavelengths by a narrow band module, it can achieve emission of specific pulsed light in a very narrow wavelength range by exploiting an oscillation phenomenon. Still better, the specific wavelengths can set a preset spectral width. Japanese Patent Laid-Open No. 2006-024855 discloses a technique of generating light with specific wavelengths packed into a very narrow band by a narrow band module, and correcting the wavefront aberration of the light emerging from the narrow band module, thereby changing the spectral width.

A conventional exposure apparatus uses light from an excimer laser for the following two purposes. One purpose is to project and transfer the pattern of a reticle onto a semiconductor wafer using pulsed light emitted by an excimer laser. Another purpose is to measure the position of a wafer stage via a reticle and a projection lens using light from an excimer laser.

Since the above-mentioned excimer lasers are gas lasers, periodical gas exchange is performed. This gas exchange often fluctuates the composition ratio of the gas inside the gas chamber, and, in turn, fluctuates the spectral distribution of the pulsed light. In addition, the characteristics of optical components present in the above-mentioned narrow band module also often change with time. This again accounts for a fluctuation in the spectral distribution.

Furthermore, although the above-mentioned excimer lasers have a function of maintaining the spectral width of the light constant, its spectral distribution fluctuates, as shown in FIG. 2, due to various factors associated with the internal environment of the excimer laser and, especially, with the oscillation frequency. Japanese Patent Laid-Open No. 2004-288874 points out this issue as well. This patent reference reveals that factors associated with the number of times of emission per second (frequency) result in acoustic waves, which adversely affect, for example, the spectral line width and the energy of the laser light.

As described above, the spectral distribution of an excimer laser used in an exposure apparatus often fluctuates due to various factors. Fluctuations attributed to these factors often adversely affect the pattern transfer performance of the exposure apparatus. When the spectral distribution of the excimer laser fluctuates, the contrast of a pattern to be projected and transferred naturally changes. When the contrast of that pattern changes, not only the contrast of the transferred pattern lowers but also the transferred pattern deforms because the degree of influence of that change differs among individual pattern elements to be transferred.

The technique described in Japanese Patent Laid-Open No. 2006-024855 can correct the spectral distribution which changes depending on the laser oscillation frequency to a target distribution by adjusting the position of a wavefront aberration adjusting mechanism included in the narrow band module. However, the exposure apparatus often uses different laser oscillation frequencies for exposure and for measurement of the position of the wafer stage. Laser oscillation for position measurement is performed at the maximum oscillation frequency of the laser because the completion of measurement in a short period of time leads to enhancement of the productivity of semiconductors. Laser oscillation for exposure is to expose a resist to light, so the exposure dose changes depending on, for example, the resist sensitivity. Hence, laser oscillation for exposure is sometimes performed at a relatively low frequency instead of the maximum frequency of the laser to suppress the exposure dose to be small.

SUMMARY OF THE INVENTION

If the exposure apparatus uses different oscillation frequencies for exposure and for measurement of the position of the wafer stage, it must inevitably adjust the spectral width between the measurement and the exposure to return it to a predetermined spectral width in accordance with the laser characteristics. This adjustment is performed while observing the spectral distribution by adjusting optical components of, for example, the narrow band module, and therefore requires much time. In addition, when the center wavelength of the laser light fluctuates, the focus position of the exposure apparatus naturally changes, making it difficult to transfer a fine pattern as desired.

The present invention provides an exposure apparatus which can reduce a fluctuation in spectral distribution of pulsed light for use in exposure.

According to an aspect of the present invention, there is provided an apparatus which exposes a substrate via a pattern of a reticle using pulsed light generated by a light source, the apparatus comprising a controller configured to control the light source so that an oscillation frequency of the light source changes periodically while the exposure apparatus exposes the substrate. The oscillation frequency is the number of times of emission of the light source per unit time.

Further features of the present invention will become apparent from the following description of exemplary embodiments with reference to the attached drawings.

DESCRIPTION OF THE EMBODIMENTS

Embodiments according to the present invention will be described in detail below with reference to FIGS. 1 to 3. Note that the following embodiments are merely examples of the present invention, and the present invention is also applicable to embodiments obtained by changing or modifying the following embodiments without departing from the spirit and scope of the present invention.

Figure 1:
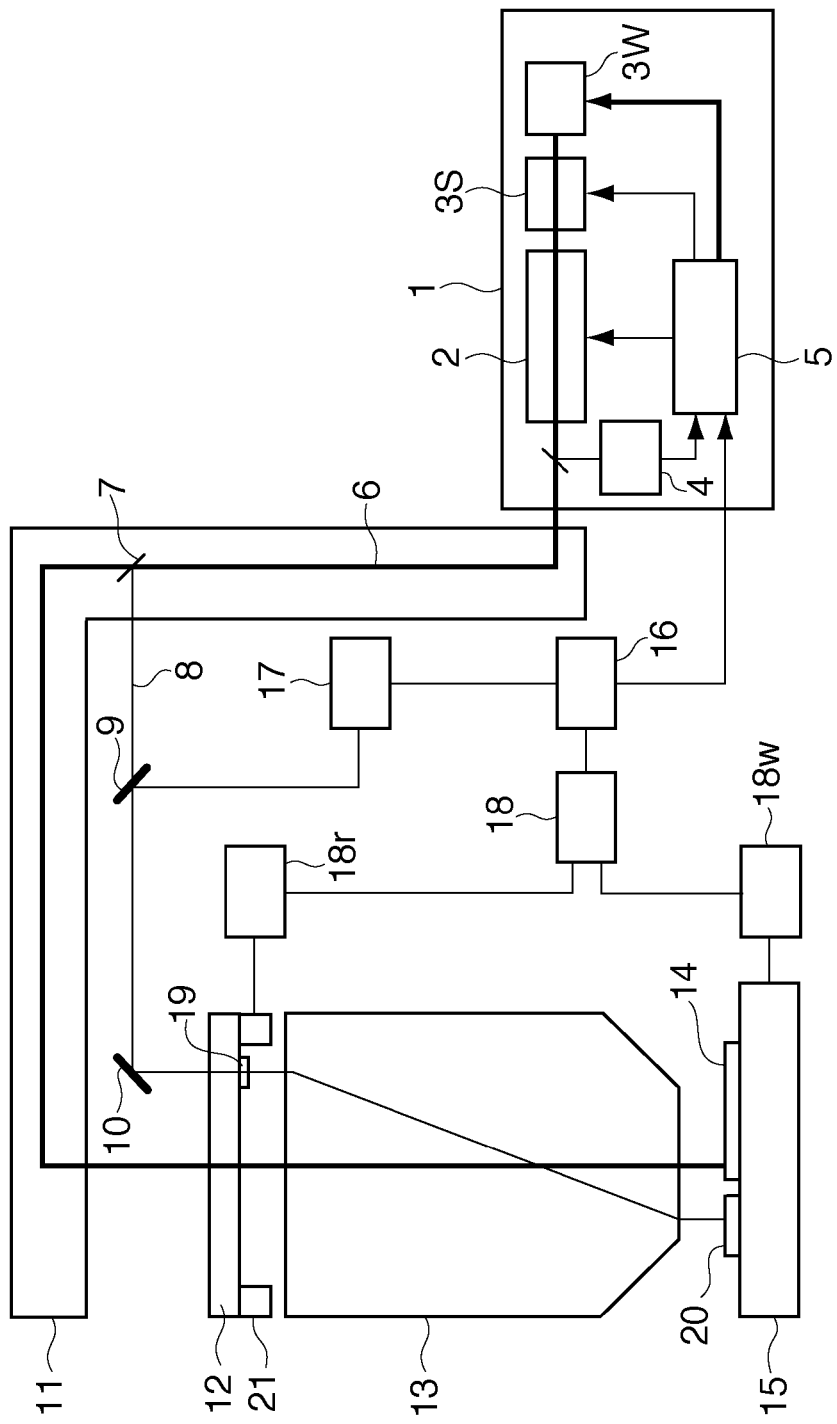
FIG. 1 is a block diagram showing an example of an exposure apparatus according to the present invention.
Figure 2:
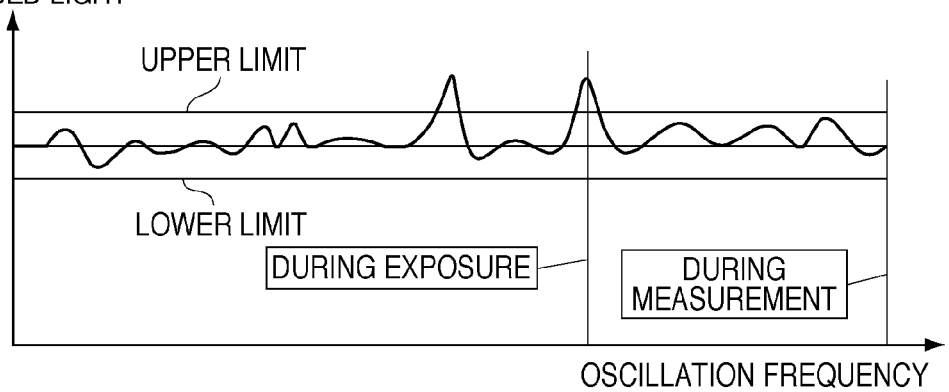
FIG. 2 is a graph for explaining a fluctuation in spectral distribution of an excimer laser.

In this embodiment, an exposure apparatus of the step & scan scheme which exposes a substrate to slit-like pulsed light, shown in FIG. 1, is used as an exposure apparatus which exposes a substrate via the pattern of a reticle. However, an exposure apparatus of the step & repeat scheme can also be used instead. An excimer laser 1 serves as a light source which generates and supplies pulsed light. The excimer laser 1 includes a gas chamber 2, narrow band module 3W, spectrum adjusting module 3S, wavelength meter 4, and intra-laser controller 5, and outputs pulsed light 6. The gas chamber 2 is filled with an excimer gas inside the excimer laser 1. The narrow band module 3W selects specific wavelengths of the pulsed light 6, and packs them into a narrow band. The wavelength meter 4 measures the center wavelength and spectral distribution of the pulsed light 6. The intra-laser controller 5 triggers a pulse generator (not shown) to apply a high-voltage pulse to the gas chamber 2. Also, the intra-laser controller 5 reads the center wavelength and spectral distribution of the pulsed light 6 measured by the wavelength meter 4 for each pulse emission, and outputs a driving control command to the narrow band module 3W so that the center wavelength and spectral distribution of the next pulsed light become command values. In this embodiment, the intra-laser controller 5 triggers the pulse generator and outputs a driving control command to the narrow band module 3W. However, these functions of the intra-laser controller 5 may be imparted instead to an excimer laser controller 16 (to be described later) of the exposure apparatus.

The excimer laser 1 can select and return only specific wavelengths to the gas chamber 2 by the narrow band module 3W. Hence, the excimer laser 1 can achieve emission of specific pulsed light 6 in a very narrow wavelength range by exploiting an oscillation phenomenon, and can change the above-mentioned specific wavelengths to some extent. In addition, the excimer laser 1 can control its spectral distribution by adjusting optical members using an actuator inside the excimer laser 1. The excimer laser 1 can change the number of times of pulse oscillation per unit time, that is, the oscillation frequency, as will be described later.

The exposure apparatus projects and transfers the pattern of a reticle 12 onto a substrate 14 using the pulsed light 6 emitted by the excimer laser 1 to expose the substrate 14. This projection and transfer will be explained next.

The pulsed light 6 emitted by the excimer laser 1 is converted into nearly uniform illumination light for illuminating the reticle 12 by an illumination optical system 11. The illumination light projects the pattern of the reticle 12 mounted on a reticle stage 21 onto the substrate 14 via a projection lens 13. The substrate 14 is mounted on a substrate stage 15 which can move in the X, Y, and Z directions. The excimer laser controller 16 instructs the excimer laser 1 about the energy for each pulse emission and the pulse emission timings. Interferometers 18r and 18w measure the positions of the reticle stage 21 and substrate stage 15, respectively, and a stage controller 18 controls the positions of the reticle stage 21 and substrate stage 15 to drive these two stages 21 and 15 in synchronism with each other.

The exposure apparatus includes a position measurement unit which measures the relative position between the reticle 12 and the substrate stage 15. The position measurement unit calculates the relative distance between the substrate stage 15 and the reticle 12, and measures the relative position between the substrate stage 15 and the substrate 14 using a wafer microscope (not shown). The relative position between the substrate 14 and the reticle 12 is precisely determined by these two measurements. The substrate 14 and the reticle 12 are aligned with each other based on their determined relative positions. The position measurement unit, that is, a calibration measurement unit for the reticle 12 and the substrate stage 15 will be explained below.

The pulsed light 6 from the excimer laser 1 is partially split. One split component of the pulsed light 6 illuminates a reticle mark 19 formed on the reticle stage 21 or reticle 12 via mirrors 9 and 10. A reticle mark image reflected by the reticle mark 19 becomes incident on a photoelectric conversion element 17. On the other hand, light having passed through the reticle mark 19 illuminates a stage mark 20 mounted on the substrate stage 15 via the projection lens 13. A stage mark image reflected by the stage mark 20 retraces its optical path in the projection lens 13, is transmitted through the reticle mark 19, and becomes incident on the photoelectric conversion element 17. The images reflected by the reticle mark 19 and stage mark 20 are composited on the photoelectric conversion element 17 and captured at once. The captured mark images are processed to measure the amount of relative shift between the reticle mark 19 and the stage mark 20.

Position measurement of an image processing scheme has been explained herein. However, the positions of the reticle mark 19 and stage mark 20 may be detected by an aerial image scheme. In the aerial image scheme, a photoelectric conversion element is mounted on the substrate stage 15, and receives light beams having passed through slits respectively formed in the reticle mark 19 and stage mark 20.

An operation for controlling light from the excimer laser 1 to stabilize the spectral distribution of the pulsed light will be explained in detail below. The excimer laser controller 16 is provided in the exposure apparatus as a controller which controls a pulsed light source. The excimer laser controller 16 controls emission of the excimer laser 1. That is, the excimer laser controller 16 outputs the command values of the center wavelength and spectral distribution to the intra-laser controller 5, and outputs an emission command after setting the number of exposure pulses via a communication unit. The number of exposure pulses is the number of times of emission of the excimer laser 1 per unit time when the exposure apparatus performs exposure, and is also called the oscillation frequency of the excimer laser 1. The spectral distribution, the number of exposure pulses, and the center wavelength may be set in the excimer laser 1 in advance.

The intra-laser controller 5 receives the command values of the center wavelength and spectral distribution, and the number of exposure pulses from the excimer laser controller 16. Upon this reception, the intra-laser controller 5 outputs a driving command to the narrow band module 3W to set the center wavelength. Also, the intra-laser controller 5 outputs a driving command to the spectrum adjusting module 3S to set the spectral distribution. Further, the intra-laser controller 5 sets built-in optical elements (not shown) at the positions at which the center wavelength and spectral distribution of an actual emission wavelength are expected to match their command values. After that, the intra-laser controller 5 causes the excimer laser 1 to execute actual emission in response to an emission command.

After the execution of emission, the intra-laser controller 5 causes the wavelength meter 4 to measure the center wavelength and spectral distribution of the pulsed light. If there exists an error between the measurement value and command value of the center wavelength, the intra-laser controller 5 outputs a driving command to the narrow band module 3W so as to minimize this error. The intra-laser controller 5 then stabilizes the spectrum by correcting the center wavelength and spectral distribution of the pulsed light emitted next so that they match their command values.

When the correction is complete, the stage controller 18, reticle stage 21, and substrate stage 15 are driven in synchronism with each other. At the same time, the excimer laser controller 16 issues a command to emit pulses one by one to the intra-laser controller 5. At this time, the excimer laser controller 16 issues an emission command to the intra-laser controller 5 while adjusting the pulse emission interval.

Figure 3:
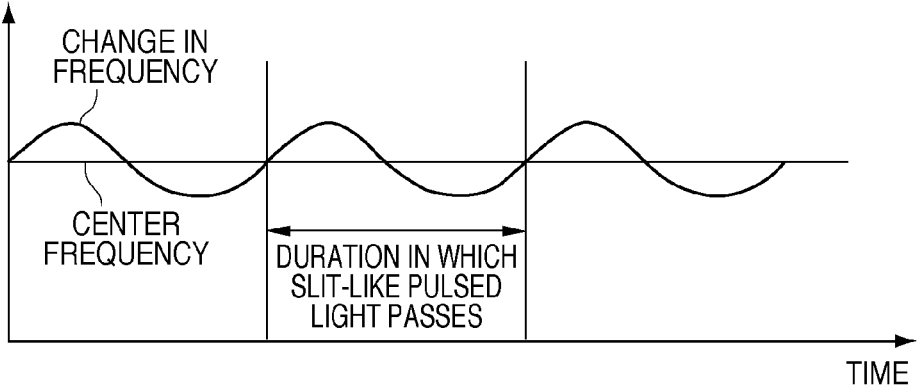
FIG. 3 is a graph for explaining control of the oscillation frequency of the excimer laser.

FIG. 3 shows a method of adjusting the pulse emission interval by the excimer laser controller 16. In scanning exposure, the illumination optical system 11 irradiates the surface of the reticle 12 with the slit-like pulsed light 6. Because the reticle 12 and substrate stage 15 move in synchronism with each other, the pulsed light 6 is integrated from the leading edge of the slit to its trailing edge and reaches a certain position on the substrate 14. In FIG. 3, the abscissa indicates time, and the ordinate indicates the number of times of pulse oscillation of the light source per unit time, that is, the oscillation frequency of the light source. When the exposure apparatus exposes the substrate 14, the excimer laser controller 16 controls the excimer laser 1 so that the oscillation frequency changes periodically, as shown in FIG. 3. The pattern according to which the oscillation frequency is adjusted in one period may have a sinusoidal waveform shown in FIG. 3 or may have a triangular waveform. Note, however, that the oscillation frequency is uniformly distributed as much as possible so as to prevent the oscillation frequency from changing asymmetrically with respect to a given point of time in one period.

The oscillation frequency of the excimer laser 1 is controlled based on a command from the excimer laser controller 16 to the excimer laser 1. The command value from the excimer laser controller 16 may be the oscillation frequency itself, the period of a change in oscillation frequency, the exposure time at a certain position on the wavelength meter 4, or information concerning the start and end of an exposure process and a measurement process (to be described later). If a command value from the excimer laser controller 16 is not the oscillation frequency itself, the intra-laser controller 5 calculates (determines) the oscillation frequency from the command value, and controls the oscillation frequency of the excimer laser 1. As long as the oscillation frequency, the exposure timing, and the like are determined in advance, the excimer laser 1 may solely control the oscillation frequency based on the oscillation frequency and the like determined in advance.

In this manner, the following two effects are obtained by controlling the excimer laser 1 so that the oscillation frequency changes periodically. First, it is possible to eliminate the adverse effect of acoustic waves, which appear at the oscillation frequency during exposure, shown in FIG. 2. The generation of such acoustic waves is presumably accounted for by a resonance phenomenon between the pulse oscillation and the oscillation of the gas chamber. In view of this, the generation of acoustic waves is suppressed and then the spectral distribution of the pulsed light 6 is stabilized by periodically changing the oscillation frequency of the excimer laser 1 in the neighborhood of the oscillation frequency during exposure. Second, it is possible to maintain the amount of light that impinges on the substrate 14 during exposure constant. Because the substrate 14 moves during exposure, the time at which slit-like pulsed light passes changes depending on the position on the substrate 14. In contrast, the duration in which slit-like pulsed light passes stays unchanged irrespective of the position on the substrate 14. The duration in which a certain position on the substrate is scan-exposed to slit-like pulsed light is the one obtained by dividing the length of the slit in the scanning direction by the scanning velocity of the substrate stage 15. Then, when the oscillation frequency is changed so that the duration in which the substrate 14 passes through the slit is an integer multiple of the period of a change in oscillation frequency, light beams having the same number of pulses reach all positions on the substrate 14.

An exposure apparatus performs processes roughly classified into a calibration process and an exposure process. In the calibration process, the exposure apparatus performs measurement for alignment between a reticle 12 and a substrate 14 after the reticle 12 and substrate 14 are loaded into the exposure apparatus. In the exposure process, the exposure apparatus transfers the pattern on the reticle 12 onto the substrate 14 after the calibration process.

In the exposure process, the exposure apparatus exposes the substrate 14 using pulsed light 6 emitted while periodically changing its oscillation frequency within the range of oscillation frequencies appropriate for the exposure process. On the other hand, in the calibration process, the exposure apparatus observes and captures the reticle mark 19 and stage mark 20 using pulsed light 6 emitted while periodically changing its oscillation frequency within the range of oscillation frequencies appropriate for the calibration process. With this operation, the exposure apparatus performs measurement for alignment between the reticle 12 and the substrate 14. Even when the oscillation frequencies in the exposure process and the calibration process are different from each other, they are periodically changed within the ranges of oscillation frequencies appropriate for the respective processes. Note that when deterioration in spectral distribution attributed to the adverse effect of acoustic waves in the calibration process is tolerable, the oscillation interval in the neighborhood of the oscillation frequency may not always be adjusted.

In the above-mentioned embodiment, measurement for alignment between the reticle 12 and the substrate 14 is performed using pulsed light emitted by an exposure light source. However, measurement for alignment between the reticle 12 and the substrate 14 can also be performed using pulsed light from a second light source different from the exposure light source. Also, the excimer laser controller 16 may be built in a light source apparatus and control the light source based on the signal from the exposure apparatus.

An embodiment of a method of manufacturing a device using the above-mentioned exposure apparatus will be explained next. The device is manufactured by a step of exposing a substrate coated with a photosensitive agent using the above-mentioned exposure apparatus, a step of developing the substrate exposed in the step of exposing the substrate, and known subsequent steps. The device can be, for example, a semiconductor integrated circuit device or a liquid crystal display device. The substrate can be, for example, a wafer or a glass plate. The known subsequent steps are steps of, for example, oxidation, film formation, vapor deposition, doping, planarization, etching, resist removal, dicing, bonding, and packaging.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-335220, filed Dec. 26, 2008, which is hereby incorporated by reference herein in its entirety.

What is claimed is:

1. An apparatus which exposes a substrate via a pattern of a reticle using a first pulsed light generated by a first light source, the apparatus comprising:

a controller configured to control the first light source so that an oscillation frequency of the first light source changes periodically while the apparatus exposes the substrate, the oscillation frequency being number of times of emission of the first light source per unit time, wherein the apparatus scan-exposes the substrate using the first pulsed light, and the controller controls the first light source so that a duration in which a certain position on the substrate is scan-exposed using the first pulsed light is an integer multiple of a period of a change in the oscillation frequency.

2. The apparatus according to claim 1, wherein the apparatus performs measurement for alignment between the reticle and the substrate using the first pulsed light.

3. The light source apparatus which supplies a first pulsed light from a first light source and is used in an apparatus that exposes a substrate via a pattern of a reticle, the first light source apparatus comprising:

a controller configured to control the first light source so that an oscillation frequency of the first light source changes periodically while the apparatus exposes the substrate, the oscillation frequency of the first light source being number of times of emission of the first light source per unit time, wherein the apparatus scan-exposes the substrate using the first pulsed light, and the controller controls the first light source so that a duration in which a certain position on the substrate is scan-exposed using the first pulsed light is an integer multiple of a period of a change in the oscillation frequency.

4. The light source apparatus according to claim 3, wherein the apparatus performs measurement for alignment between the reticle and the substrate using the first pulsed light.

5. A method comprising:

exposing a substrate to radiant energy using an apparatus;

developing the exposed substrate; and processing the developed substrate to manufacture a device, wherein the apparatus exposes the substrate via a pattern of a reticle using a first pulsed light generated by a first light source, and comprises a controller configured to control the first light source so that an oscillation frequency of the first light source changes periodically while the apparatus exposes the substrate, the oscillation frequency being number of times of emission of the first light source per unit time, wherein the apparatus scan-exposes the substrate using the first pulsed light, and the controller controls the first light source so that a duration in which a certain position on the substrate is scan-exposed using the first pulsed light is an integer multiple of a period of a change in the oscillation frequency.

6. The method according to claim 5, wherein the apparatus performs measurement for alignment between the reticle and the substrate using the first pulsed light.

* * * * *